(12) United States Patent
Nakamoto (10) Patent No.: US 9,960,263 B2
(45) Date of Patent: May 1, 2018

(54) FIELD EFFECT TRANSISTOR AND METHOD OF MANUFACTURING THE SAME

(71) Applicant: Mitsubishi Electric Corporation, Tokyo (JP)

(72) Inventor: Takahiro Nakamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days. days.

(21) Appl. No.: 15/292,252

(22) Filed: Oct. 13, 2016

(65) Prior Publication Data

US 2017/0271494 A1    Sep. 21, 2017

(30) Foreign Application Priority Data

Mar. 18, 2016 (JP) ................................ 2016-054786

(51) Int. Cl.
*H01L 29/423* (2006.01)
*H01L 21/477* (2006.01)
(Continued)

(52) U.S. Cl.
CPC .... *H01L 29/7786* (2013.01); *H01L 21/02543* (2013.01); *H01L 21/02546* (2013.01);
(Continued)

(58) Field of Classification Search
CPC ......... H01L 21/02543; H01L 21/02546; H01L 21/28264; H01L 21/28587; H01L 21/3245; H01L 21/3247; H01L 21/441; H01L 21/477; H01L 29/205; H01L 29/42316; H01L 29/4236; H01L 29/42376; H01L 29/66462; H01L 29/772; H01L 29/7786

See application file for complete search history.

(56) References Cited

U.S. PATENT DOCUMENTS 5,682,045 A * 10/1997 Hayafuji ........... H01L 21/28587
257/12
7,750,370 B2 * 7/2010 Smorchkova ..... H01L 29/66462
257/194

(Continued)

FOREIGN PATENT DOCUMENTS

| JP | 2003-115500 A | 4/2003 |
| TW | 200937633 A | 9/2009 |
| TW | 201131761 A | 9/2011 |

OTHER PUBLICATIONS

An Office Action issued by Taiwan Patent Office dated Dec. 8, 2017, which corresponds to Taiwanese Patent Application No. 105132514 and is related to U.S. Appl. No. 15/292,252.

*Primary Examiner* — Stephen W Smoot (74) *Attorney, Agent, or Firm* — Studebaker & Brackett PC (57) ABSTRACT

A field effect transistor according to the present invention includes a semiconductor layer including a groove, an insulating film formed on an upper surface of the semiconductor layer and having an opening above the groove and a gate electrode buried in the opening to be in contact with side surfaces and a bottom surface of the groove and having parts being in contact with an upper surface of the insulating film on both sides of the opening, wherein the gate electrode has a T-shaped sectional shape in which a width of an upper end is larger than a width of the upper surface of the insulating film.

11 Claims, 7 Drawing Sheets

(51) Int. Cl.
   *H01L 29/778* (2006.01)
   *H01L 21/02* (2006.01)
   *H01L 21/28* (2006.01)
   *H01L 21/285* (2006.01)
   *H01L 21/306* (2006.01)
   *H01L 21/324* (2006.01)
   *H01L 29/205* (2006.01)
   *H01L 29/49* (2006.01)
   *H01L 29/66* (2006.01)
   *H01L 29/40* (2006.01)
   *H01L 29/812* (2006.01)
   *H01L 29/47* (2006.01)

(52) U.S. Cl.
   CPC .. *H01L 21/28264* (2013.01); *H01L 21/28587* (2013.01); *H01L 21/30612* (2013.01); *H01L 21/3247* (2013.01); *H01L 29/205* (2013.01); *H01L 29/401* (2013.01); *H01L 29/4236* (2013.01); *H01L 29/42316* (2013.01); *H01L 29/42376* (2013.01); *H01L 29/495* (2013.01); *H01L 29/66462* (2013.01); *H01L 29/66871* (2013.01); *H01L 29/812* (2013.01); *H01L 29/8128* (2013.01); *H01L 29/475* (2013.01)

(56) References Cited

U.S. PATENT DOCUMENTS

| | | | |
|---|---|---|---|
| 2003/0025208 | A1 | 2/2003 | Makiyama et al. |
| 2007/0269968 | A1* | 11/2007 | Saxler ............... H01L 29/66462 438/522 |
| 2008/0124852 | A1* | 5/2008 | Ahn .................. H01L 21/28587 438/182 |
| 2009/0078966 | A1 | 3/2009 | Asai et al. |
| 2011/0147798 | A1 | 6/2011 | Radosavljevic et al. |
| 2012/0261720 | A1* | 10/2012 | Puglisi ............. H01L 29/66462 257/194 |
| 2014/0097471 | A1* | 4/2014 | Briere .................. H01L 29/402 257/194 |
| 2015/0236109 | A1* | 8/2015 | Chang ............... H01L 29/66431 257/194 |
| 2015/0349117 | A1* | 12/2015 | Chu .................... H01L 29/7827 257/66 |

* cited by examiner

FIELD EFFECT TRANSISTOR AND METHOD OF MANUFACTURING THE SAME

BACKGROUND OF THE INVENTION

Field

The present invention relates to a field effect transistor and a method of manufacturing the same, and a field effect transistor suitably used in a high-frequency band and a method of manufacturing the same.

Background

With an increase in frequency of a field effect transistor, shortening of a gate length thereof is advanced. On the other hand, when the gate length is shortened, a gate resistance increases. Unexamined Patent Publication No. 2003-115500 discloses, as a method of suppressing the gate resistance, a T-shaped gate electrode having a T-shaped sectional shape. Unexamined Patent Publication No. 2003-115500 discloses a gate electrode including an overlapping structure as a countermeasure against a short channel effect caused by shortening the gate length. In the overlapping structure, a gate end runs on an insulating film to make it possible to moderate an electric field generated between a source and a drain.

In the structure described in Unexamined Patent Publication No. 2003-115500, an interface between a semiconductor layer and an insulating film and a lower end of a gate electrode are disposed at the same level. Interface states occur on the interface between the semiconductor layer and the insulating film. For this reason, the structure described in Unexamined Patent Publication No. 2003-115500, electron conduction is easily influenced the interface states. Thus, electrons become to be easily trapped by the interface states, and pulse characteristics may be deteriorated.

SUMMARY

The present invention has been made to solve the above problem and has as its first object to obtain a field effect transistor being capable of improving pulse characteristics.

It is a second object to obtain a method of manufacturing a field effect transistor being capable of improving pulse characteristics.

The features and advantages of the present invention may be summarized as follows.

According to the first invention, a field effect transistor includes a semiconductor layer including a groove, an insulating film formed on an upper surface of the semiconductor layer and having an opening above the groove and a gate electrode buried in the opening to be in contact with side surfaces and a bottom surface of the groove and having parts being in contact with an upper surface of the insulating film on both sides of the opening, wherein the gate electrode has a T-shaped sectional shape in which a width of an upper end is larger than a width of the upper surface of the insulating film.

According to the second invention, a method of manufacturing a field effect transistor includes a step of forming an insulating film on an upper surface of a semiconductor layer, a step of forming an opening in the insulating film and a step of forming a gate electrode to bury the opening and to be in contact with an upper surface of the insulating film on both sides of the opening, wherein the step of forming the gate electrode includes a step of forming a lower electrode made of Pt to be in contact with the semiconductor layer in the opening and a step of executing thermal treatment to the gate electrode to sink the lower electrode in the semiconductor layer and the gate electrode is formed to have a T-shaped sectional shape in which a width of an upper end is larger than a width of the upper surface of the insulating film.

Other and further objects, features and advantages of the invention will appear more fully from the following description.

DESCRIPTION OF EMBODIMENTS

A field effect transistor and a method of manufacturing the same according to an embodiment of the present invention will be described with reference to the accompanying drawings. Components identical or corresponding to each other are indicated by the same reference characters, and repeated description of them is avoided in some cases.

First Embodiment

Figure 1:
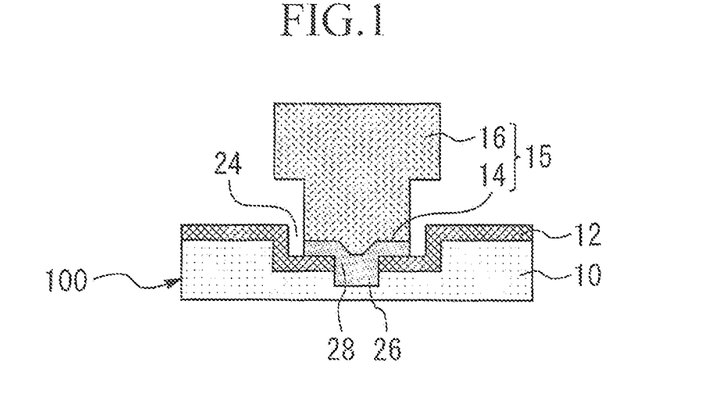
FIG. 1 is a sectional view of a field effect transistor according to Embodiment 1 of the present invention.

FIG. 1 is a sectional view of a field effect transistor 100 according to Embodiment 1 of the present invention. A semiconductor layer 10 is a semiconductor active region including a layer made of a compound semiconductor. In this embodiment, the semiconductor layer 10 includes a GaAs layer. In addition, the semiconductor layer 10 may include an InP layer. The semiconductor layer 10 includes a concave portion 24. In the field effect transistor 100, the semiconductor layer 10 increases in thickness on both the ends of the concave portion 24. This structure advantageously reduces a parasitic resistance. A groove 26 is formed in the bottom surface of the concave portion 24. An insulating film 12 is disposed on the upper surface of the semiconductor layer 10. The insulating film 12 is an SiN film. The insulating film 12 has an opening 28 above the groove 26.

A gate electrode 15 is disposed to bury the opening 28. The gate electrode 15 is disposed to be in contact with the side surfaces and the bottom surface of the groove 26. The gate electrode 15 has a part being in contact with the upper surface of the insulating film 12 on both the sides of the opening 28. Furthermore, the gate electrode 15 has a T-shaped section in which a width at an upper end is larger than a width on the upper surface of the insulating film 12. The concave portion 24 is disposed to have a width larger than the width of the gate electrode 15 on the upper surface of the insulating film 12.

The gate electrode 15 includes a lower electrode 14 and an upper electrode 16. The lower electrode 14 is formed on, of the gate electrode 15, a portion being in contact with the bottom surface of the groove 26. The lower electrode 14 has parts being in contact with the upper surface of the insulating film 12 on both the sides of the opening 28. The lower electrode 14 is made of Pt. The upper electrode 16 is disposed on the upper surface of the lower electrode 14. The upper electrode 16 has a T-shaped section in which a width at an upper end is larger than a width of a portion being in contact with the lower electrode 14. The upper electrode 16 includes a structure in which Ti, Pt, and Au layers are laminated. The upper electrode 16 may employs a structure in which Ti, Mo, and Al layers are laminated.

Figure 2:
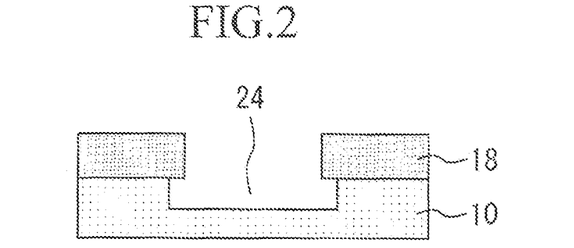
FIG. 2 is a sectional view showing a state in which a concave portion is formed in a semiconductor layer in Embodiment 1 of the present invention.

A method of manufacturing the field effect transistor according to the embodiment will be described below with reference to FIGS. 2 to 8. First, an EB (Electron Beam) drawing resist 18 is formed on the upper surface of the semiconductor layer 10. Next, an opening pattern is formed in the EB drawing resist 18. The opening pattern has a size of 0.5 to 1.0 µm. Next, as shown in FIG. 2, the semiconductor layer 10 is etched by using the EB drawing resist 18 as a mask. As a result, the concave portion 24 is formed in the semiconductor layer 10. The concave portion 24 has a depth of 50 to 200 nm.

Figure 3:
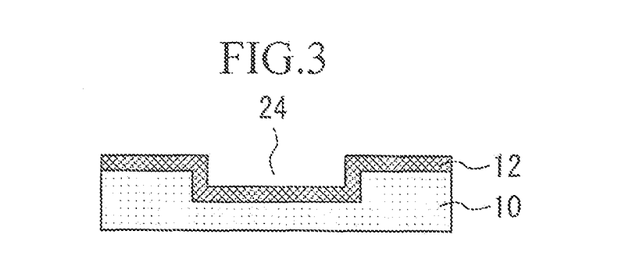
FIG. 3 is a sectional view showing a state in which an insulating film is formed on the structure in FIG. 2 in Embodiment 1 of the present invention.
Figure 4:
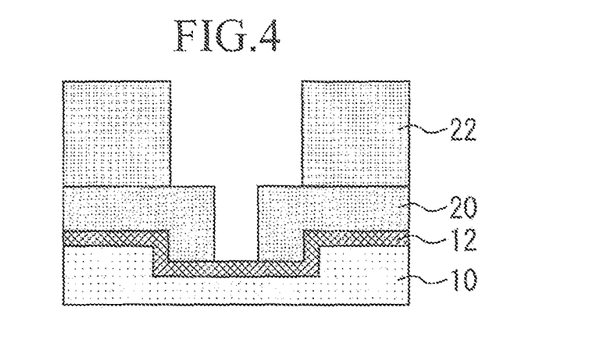
FIG. 4 is a sectional view showing a state in which a two-layered resist is formed on the structure in FIG. 3 in Embodiment 1 of the present invention.

Next, as shown in FIG. 3, the insulating film 12 is formed on the upper surface of the semiconductor layer 10. The insulating film 12 has a thickness of 10 to 100 nm. Next, a step of forming the gate electrode 15 will be executed. First, as shown in FIG. 4, a two-layered resist is formed on the upper surface of the insulating film 12. The two-layered resist includes an EB drawing resist 20 and a photoresist 22. The EB drawing resist 20 is disposed on the upper surface of the insulating film 12. The photoresist 22 is disposed on the upper surface of the EB drawing resist 20. An opening having a width of 0.05 to 0.15 µm is formed in the EB drawing resist 20. The photoresist 22 has an opening having a width of 0.5 to 1.0 µm formed above the opening formed in the EB drawing resist 20.

Figure 5:
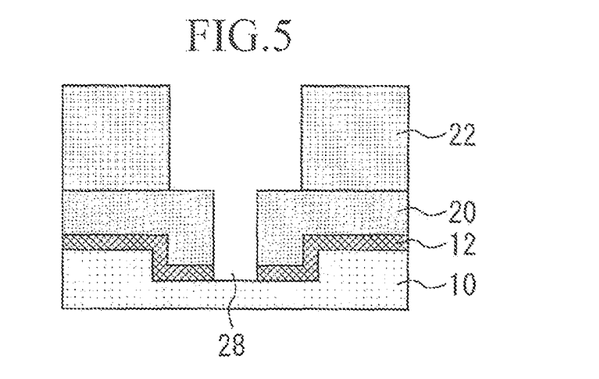
FIG. 5 is a sectional view showing a state in which the insulating film in FIG. 4 is etched in Embodiment 1 of the present invention.
Figure 6:
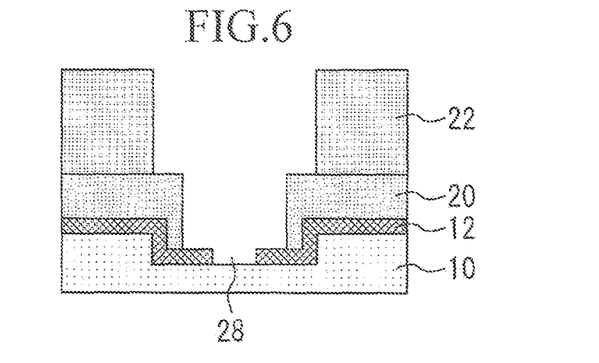
FIG. 6 is a sectional view showing a state in which an opening in the two-layered resist in FIG. 5 is increased in width in Embodiment 1 of the present invention.

Next, the insulating film 12 is etched as shown in FIG. 5 to form the opening 28. As a result, the semiconductor layer 10 is exposed in the opening 28. Next, as shown in FIG. 6, the widths of the openings formed in the EB drawing resist 20 and the photoresist 22 are increased by about 1 µm by means of asher processing. Next, Pt, Ti, Pt, and Au are deposited on the upper surfaces of the two-layered resist, the insulating film 12, and the semiconductor layer 10 to obtain laminated layers. In this case, the lowermost Pt layer is in contact with the semiconductor layer 10 in the opening 28. The Pt layer serves as a lower electrode 14. The Pt layer is deposited to have a thickness of 5 to 25 nm. The Ti, Pt, and Au layers are laminated to a level at which the opening formed in the photoresist 22 is partially or fully buried with the layers. The laminated Ti, Pt, and Au layers serve as the upper electrode 16.

Figure 7:
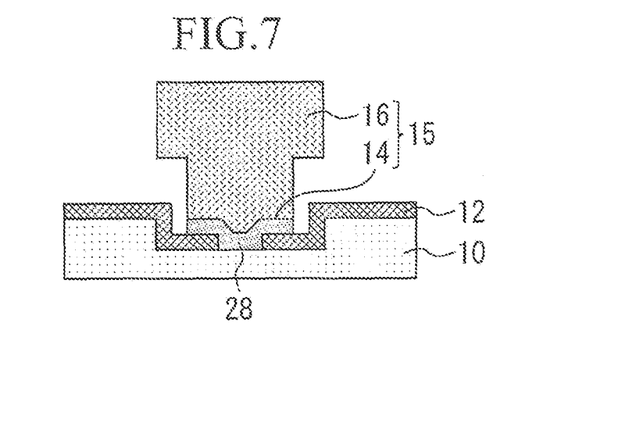
FIG. 7 is a sectional view showing a state in which a gate electrode is formed on the structure in FIG. 6 in Embodiment 1 of the present invention.
Figure 8:
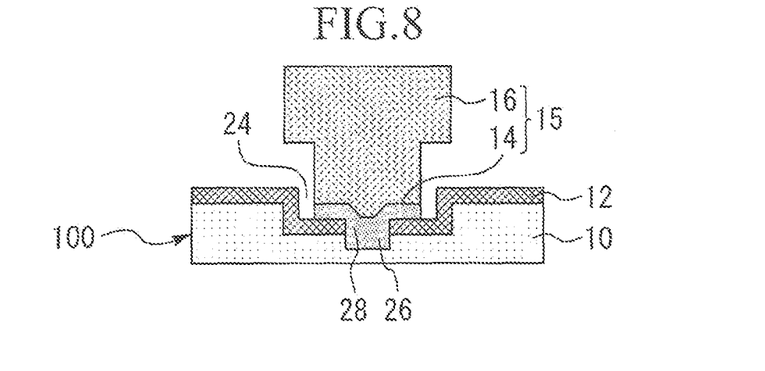
FIG. 8 is a sectional view showing a state in which the gate electrode in FIG. 7 is sunk in the semiconductor layer in Embodiment 1 of the present invention.

Next, as shown in FIG. 7, a lift-off process is executed to remove the two-layered resist. As a result, the gate electrode 15 is formed on the upper surface of the insulating film 12. The gate electrode 15 is a T-shaped gate electrode having a T-shaped section. Next, as shown in FIG. 8, thermal treatment is executed to sink the lower electrode 14 in the semiconductor layer 10. As a result, the lower end of the gate electrode 15 is formed 5 to 50 nm below the interface between the semiconductor layer 10 and the insulating film 12 on the bottom surface of the concave portion 24.

Figure 9:
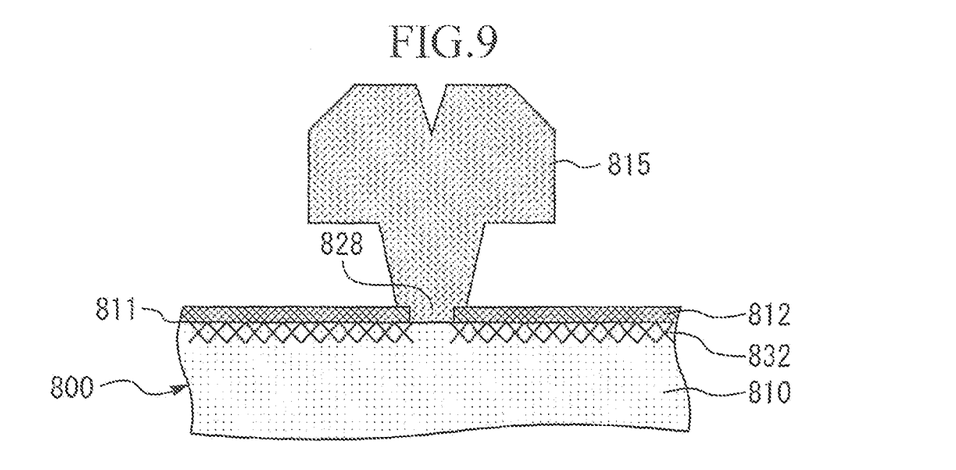
FIG. 9 is a sectional view of a field effect transistor according to a comparative example of Embodiment 1 of the present invention.

FIG. 9 is a sectional view of a field effect transistor 800 according to a comparative example of Embodiment 1 of the present invention. In the field effect transistor 800 according to the comparative example, the gate electrode 815 and the semiconductor layer 810 are in contact with each other in an opening 828 formed in the insulating film 812. In this case, interface states 832 occur on an interface 811 between the semiconductor layer 810 and the insulating film 812 in the semiconductor layer 810. The lower end of the gate electrode 815 is at a level equal to the interface 811. At this time, electrons near the lower end of the gate electrode 815 are considerably influenced by the interface states 832. For this reason, the electrons easily become to be trapped by the interface states 832. As a result, the pulse characteristics of the field effect transistor 800 may be deteriorated.

In contrast to this, in a method of manufacturing the field effect transistor 100 according to the embodiment, the lower electrode 14 is sunk in the semiconductor layer 10 by heat treatment. As a result, the lower end of the gate electrode 15 is disposed below the interface between the semiconductor layer 10 and the insulating film 12. Thus, electrons near the lower end of the gate electrode 15 can be suppressed from being influenced by the interface states. Therefore, the pulse characteristics can be improved.

Figure 10:
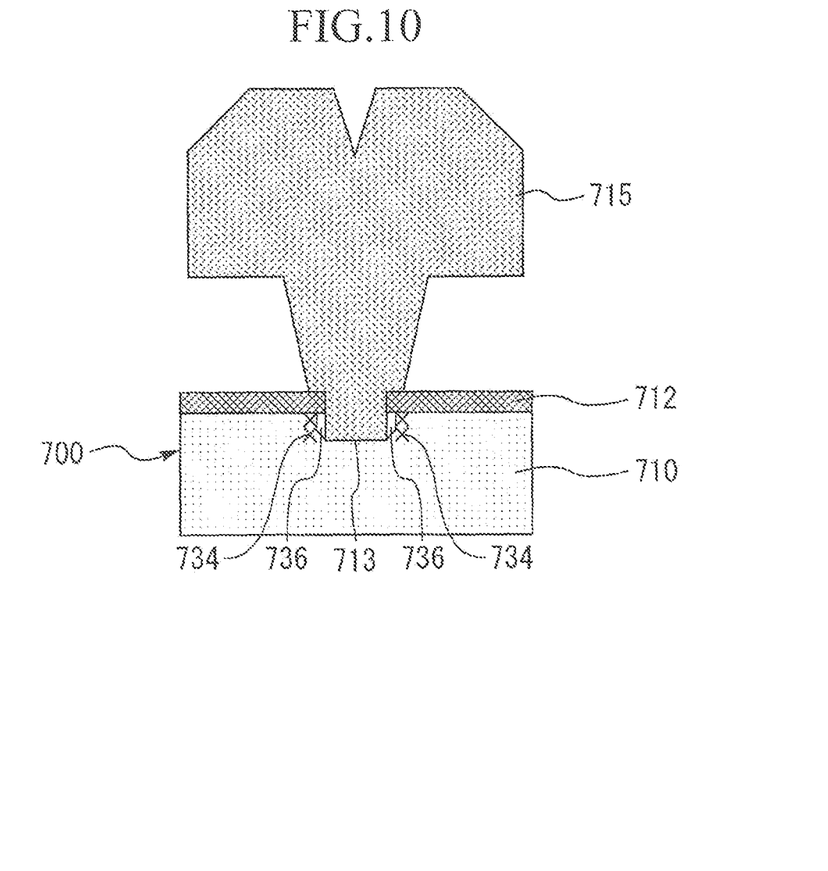
FIG. 10 is a sectional view of a field effect transistor according to a comparative example of Embodiment 1 of the present invention.

FIG. 10 is a sectional view of a field effect transistor 700 according to a comparative example of Embodiment 1 of the present invention. In the embodiment, the lower electrode 14 is sunk in the semiconductor layer 10 by thermal treatment. As another method of forming the lower end of the gate electrode below the interface of the semiconductor layer, a method using wet etching may be considered. In the method of manufacturing the field effect transistor 700 shown in FIG. 10, a recess 713 is formed in a semiconductor layer 710 by wet etching. Thereafter, a gate electrode 715 is formed on the recess 713 and the upper surface of the insulating film 712.

In this case, as shown in FIG. 10, in use of wet etching, a gap 736 may be formed between the side surface of the recess 713 and the gate electrode 715. At this time, surface states 734 occur at a part exposed to the gap 736 on the semiconductor layer 710. The influence of the surface states 734 may deteriorate the pulse characteristics. A chemical solution to form the recess 713 may remain in the recess 713. For this reason, the influence of the chemical solution may deteriorate the reliability.

In the method of manufacturing the field effect transistor 100 according to the embodiment, the lower electrode 14 is sunk in the semiconductor layer 10 by thermal treatment. According to this method, since the Pt layer is diffused in the semiconductor layer 10 by chemical reaction, no gap is formed between the gate electrode 15 and the groove 26. As a result, the gate electrode 15 is in contact with the side surfaces and the bottom surface of the groove 26. According to this structure, surface states can be prevented from occurring. For this reason, the pulse characteristics can be suppressed from being deteriorated by the surface states. Chemical solution is not used in the step of sinking the gate electrode 15. Thus, the reliability can be prevented from being deteriorated by the residual chemical solution.

Like the field effect transistor 100 according to the embodiment, in the burying structure in which the gate electrode is buried in the semiconductor layer, a gate length may be shortened. When the gate length is shortened, a gate resistance increases. In this case, in the embodiment, the gate electrode 15 is a T-shaped gate electrode. For this reason, the sectional area of the gate electrode 15 can be increased to suppress the gate resistance from increasing.

When the gate length becomes 0.15 μm or less, a short-channel effect may conspicuous appear. The gate electrode 15 according to the embodiment has parts which are in contact with the upper surface of the insulating film 12 on both the sides of the opening 28. In an overlapping structure in which the gate electrode 15 is partially overlapped on the insulating film 12, an electric field between the source and the drain is moderated. Thus, the short-channel effect can be suppressed.

As another structure in which a gate electrode is overlapped on an insulating film, a structure in which a wide portion of the upper end of a T-shaped gate electrode is in contact with the upper surface of the insulating film is conceived. In this structure, an area in which the gate electrode is in contact with the insulating film becomes large. As a result, an element capacity increases, and the pulse characteristics may be deteriorated.

In contrast to this, in the embodiment, the game electrode 15 is a T-shaped gate electrode in which the width of the upper end is larger than the width of the upper surface of the insulating film 12. In the embodiment, the gate electrode 15 overlaps on the insulating film 12 at the narrow lower end. Thus, an area in which the gate electrode 15 is in contact with the insulating film 12 is smaller than that in the structure in which the upper end of the T-shaped gate electrode overlaps. For this reason, an element capacity can be suppressed from being increased by overlapping. Thus, the pulse characteristics can be suppressed from being deteriorated.

As described above, the structure in which the narrow lower end of the gate electrode 15 having a T-shaped section is overlapped on the insulating film 12 and the structure in which the gate electrode 15 is buried are combined to each other to make it possible to efficiently obtain an effective of improvement in the pulse characteristics.

Figure 11:
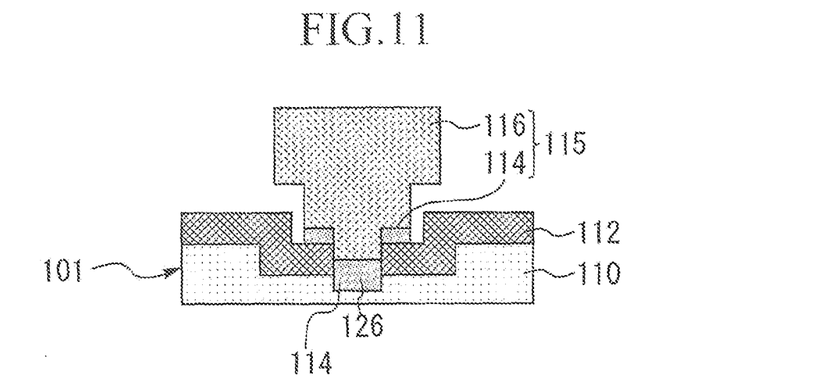
FIG. 11 is a sectional view of a field effect transistor according to a modification of Embodiment 1 of the present invention.

FIG. 11 is a sectional view of a field effect transistor 101 according to a modification of Embodiment 1 of the present invention. In the modification, a gate electrode 115 is configured by a lower electrode 114 and an upper electrode 116. In the field effect transistor 100 according to the embodiment, the lower electrode 14 is formed at a part being in contact with the bottom surface of the groove 26. In addition, the lower electrode 14 has parts being in contact with the upper surface of the insulating film 12 on both the sides of the opening 28. In this case, of the lower electrode 14, a part formed on the bottom surface of the groove 26 and a part formed on the upper surface of the insulating film 12 are assumed to be successive. In contrast to this, in the modification, of the lower electrode 114, the part formed on the bottom surface of the groove 126 and the portion formed on the upper surface of the insulating film 112 are not successive. Also in this structure, the same effect as that obtained by the field effect transistor 100 can be obtained.

In the embodiment, it is assumed that the lower electrode 14 is formed on the bottom surface of the groove 26 to have parts being in contact with the upper surface of the insulating film 12 on both the sides of the opening 28. In contrast to this, of the gate electrode 15, the portions being in contact with the upper surface of the insulating film 12 on both the sides of the opening 28 may be the upper electrode 16. In this case, the lower electrode 14 is formed only inside the groove 26 and the opening 28. In the embodiment, the upper electrode 16 is assumed to have a T-shaped section in which the width of the upper end is larger than the width of the part being in contact with the lower electrode 14. In contrast to this, of the gate electrode 15, the lower electrode 14 may be formed up to the wide upper end part.

In the embodiment, the gate electrode 15 is a T-shaped electrode. However, the gate electrode 15 is not limited to the sectional shape. The sectional shape of the gate electrode 15 need not be a T shape as long as the width of the upper end is larger than the width of the upper surface of the insulating film 12.

Second Embodiment

Figure 12:
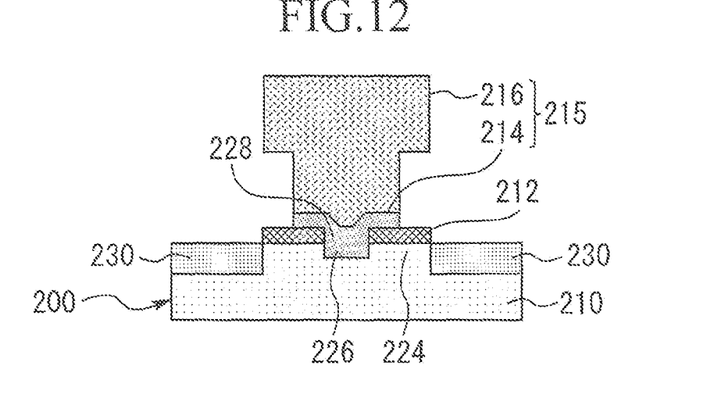
FIG. 12 is a sectional view of a field effect transistor according to Embodiment 2 of the present invention.

FIG. 12 is a sectional view of a field effect transistor 200 according to Embodiment 2 of the present invention. In the embodiment, a semiconductor layer 210 includes a convex portion 224. A groove 226 is formed in the upper surface of the convex portion 224. An insulating film 212 is disposed on the upper surface of the convex portion 224. An insulating film 212 has an opening 228 above the groove 226. As in Embodiment 1, the gate electrode 215 is disposed to bury the opening 228 and the groove 226. The gate electrode 215 has the same structure as that of the gate electrode 15 described in Embodiment 1. The width of the convex portion 224 is set to be larger than the width of the gate electrode 215 on the upper surface of the insulating film 212.

The convex portion 224 includes a layer made of a compound semiconductor. In the embodiment, the convex portion 224 has an HEMT structure including a GaAs layer. An n-type GaAs layer 230 is formed on the side surface of convex portion 224. The n-type GaAs layer 230 is disposed in an area for forming source and drain electrodes.

Figure 13:
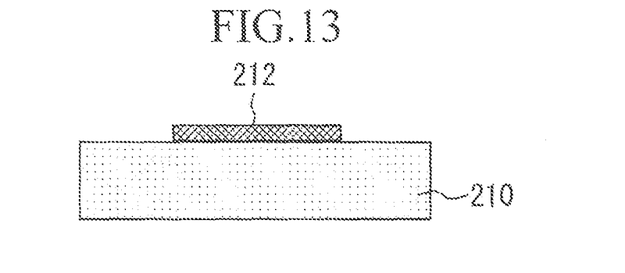
FIG. 13 is a sectional view showing a state in which an insulating film is formed on an upper surface of a semiconductor layer in Embodiment 2 of the present invention.
Figure 14:
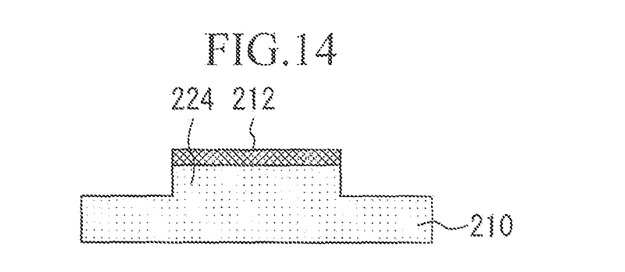
FIG. 14 is a sectional view showing a state in which the semiconductor layer in FIG. 13 is etched in Embodiment 2 of the present invention.

A method of manufacturing the field effect transistor 200 according to the embodiment will be described below with reference to FIG. 13 to FIG. 19. First, as shown in FIG. 13, of the upper surface of the semiconductor layer 210, a part on which the gate electrode is formed is covered with the insulating film 212. The insulating film 212 is an SiN film. The width of the insulating film 212 is 1.5 to 3.0 µm. Next, as shown in FIG. 14, the semiconductor layer 210 is etched by 0.2 to 1.0 µm by using the insulating film 212 as a mask. As a result, the convex portion 224 is formed on the semiconductor layer 210.

Figure 15:
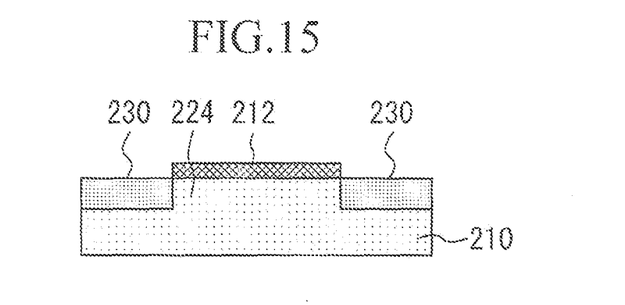
FIG. 15 is a sectional view showing a state in which an n-type GaAs layer is formed on the structure in FIG. 14 in Embodiment 2 of the present invention.
Figure 16:
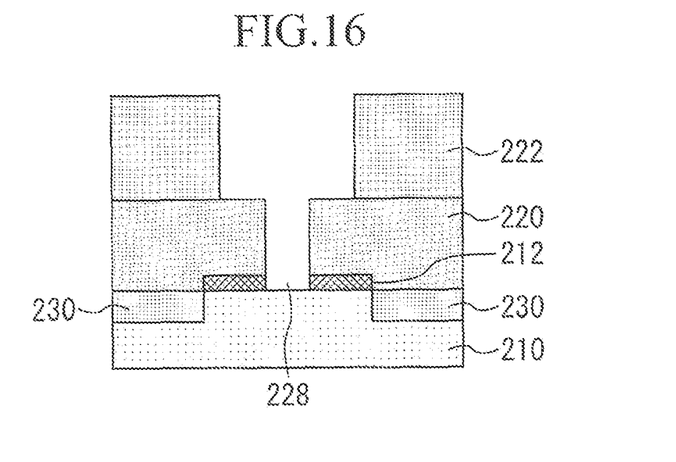
FIG. 16 is a sectional view showing a state in which a two-layered resist is formed on the structure in FIG. 15 in Embodiment 2 of the present invention.
Figure 17:
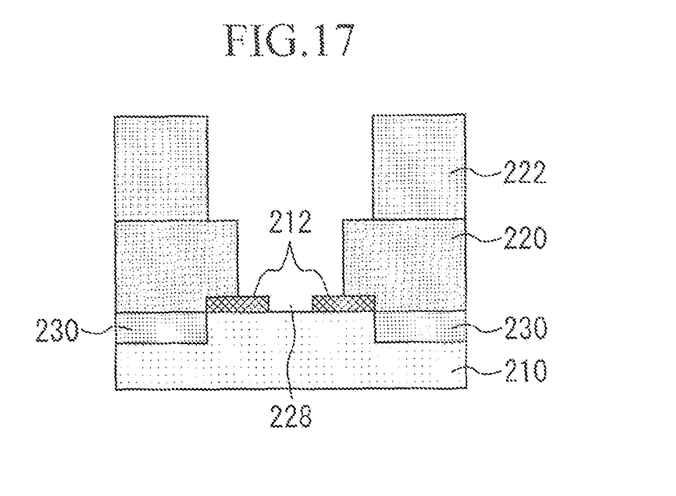
FIG. 17 is a sectional view showing a state in which an opening in the two-layered resist in FIG. 16 is increased in width in Embodiment 2 of the present invention.
Figure 18:
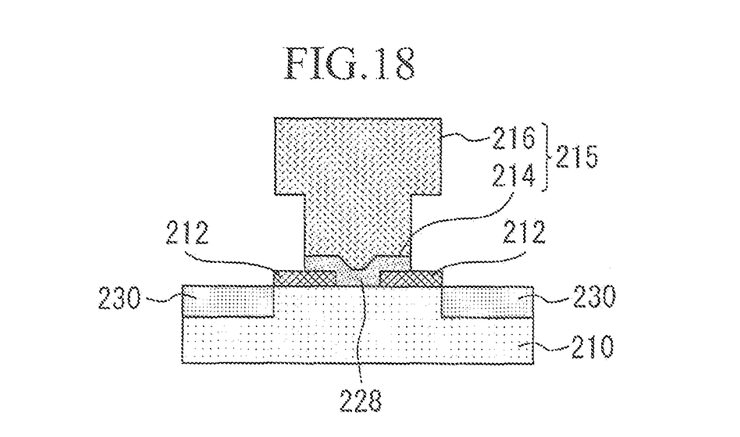
FIG. 18 is a sectional view showing a state in which a gate electrode is formed on the structure in FIG. 17 in Embodiment 2 of the present invention.
Figure 19:
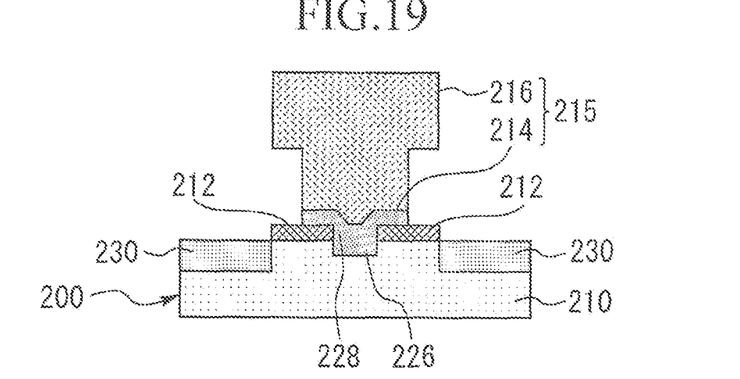
FIG. 19 is a sectional view showing a state in which a semiconductor layer is sunk in the gate electrode in FIG. 18 in Embodiment 2 of the present invention.

Next, as shown in FIG. 15, the n-type GaAs layer 230 is regrown on both the sides of the convex portion 224. Next, as shown in FIGS. 16 to 19, the gate electrode 215 is formed. A method of forming the gate electrode 215 is the same as that in Embodiment 1.

When the semiconductor layer has an HEMT structure, a hetero junction interface serves as an electron conduction barrier between the source and drain electrodes. For this reason, parasitic resistances Rs and Rd increase in the source electrode and the drain electrode, respectively. In this case, in the embodiment, the n-type GaAs layers are formed on both the side surfaces of the convex portion 224. For this reason, the n-type GaAs layers 230 are disposed to be in contact with the HEMT structure the convex portion 224 has. According to the structure, the n-type GaAs layer 230 serves as an inter-source-drain current path, and electron conduction can be prevented from being influenced by a hetero junction. Thus, the parasitic resistances Rs and Rd can be reduced in the source electrode and the drain electrode, respectively. For this reason, RF characteristics can be improved.

In the embodiment, the n-type GaAs layer 230 is formed by crystal growth. As another method of forming an n-type GaAs layer, a method of injecting Si in an ohmic electrode and executing annealing to the electrode may be conceived. In this method, when a semiconductor layer has an HEMT structure, the crystalline of the HEMT structure may be broken by the annealing. For this reason, electron mobility may become poor.

On the other hand, in the manufacturing method in the embodiment, the n-type GaAs layer 230 is formed by crystal growth. For this reason, the crystalline of the HEMT structure can be prevented from being deteriorated. Thus, the mobility is suppressed from being poor. An effect of suppressing a parasitic resistance by forming the n-type GaAs layer 230 can be efficiently produced.

In the embodiment, the convex portion 224 is assumed to have an HEMT structure including a GaAs layer. As a modification of the embodiment, the convex portion 224 may have an HEMT structure including an InP layer. In this case, an n-type InGaAs layer is formed on the side surface of the convex portion 224 by crystal growth.

In the field effect transistor according to the present invention, the lower end of the gate electrode is disposed below the interface between the semiconductor layer and the insulating film. For this reason, electrons can be suppressed from being influenced by the interface states. Thus, pulse characteristics can be improved. When the gate electrode and the semiconductor layer have a gap therebetween, surface states occur at the gap on the surface of the semiconductor layer. The influence of the surface states may allow the pulse characteristics to decrease. In the field effect transistor according to the present invention, the gate electrode is formed to be in contact with a side surface of a groove. Thus, the surface states can be suppressed from occurring. As described above, the pulse characteristics can be improved.

According to the method of manufacturing a field effect transistor according to the present invention, a lower end of a gate electrode is disposed below an interface between a semiconductor layer and an insulating film. For this reason, electrons can be suppressed from being influenced by interface states. Thus, pulse characteristics can be improved. In addition, when the gate electrode and the semiconductor layer have a gap therebetween, surface states occur at the gap on the surface of the semiconductor layer. The influence of the surface states may allow the pulse characteristics to be deteriorated. In the method of manufacturing a field effect transistor according to the present invention, the gate electrode is sunk in the semiconductor layer with thermal treatment. In this case, the gate electrode and the semiconductor layer have no gap therebetween. Thus, the surface states can be suppressed from occurring. In this manner, the pulse characteristics can be improved.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2016-054786, filed on Mar. 18, 2016 including specification, claims, drawings and summary, on which the Convention priority of the present application is based, are incorporated herein by reference in its entirety.

The invention claimed is:

1. A field effect transistor comprising:
a semiconductor layer including a groove;
an insulating film formed on an upper surface of the semiconductor layer and having an opening above the groove; and
a gate electrode buried in the opening to be in contact with side surfaces and a bottom surface of the groove, the gate having a T-shaped sectional shape and including an upper end and a lower end, the lower end being in contact with an upper surface of the insulating film on both sides of the opening,
wherein a width of the upper end is larger than a width of the lower end.

2. The field effect transistor according to claim 1, wherein the lower end of the gate electrode includes a lower electrode made of Pt at a part being in contact with the bottom surface of the groove.

3. The field effect transistor according to claim 1, wherein the semiconductor layer includes a layer made of compound semiconductor.

4. The field effect transistor according to claim 3, wherein the compound semiconductor layer has an HEMT structure including a GaAs layer, and an n-type GaAs layer is formed on a side surface of the semiconductor layer.

5. The field effect transistor according to claim 3, wherein the compound semiconductor layer has an HEMT structure including an InP layer, and an n-type InGaAs layer is formed on a side surface of the semiconductor layer.

6. The field effect transistor according to claim 1, wherein the semiconductor layer includes a concave portion wider than the width of the gate electrode on the upper surface of the insulating film, and the groove is formed on a bottom surface of the concave portion.

7. A method of manufacturing a field effect transistor, comprising:
a step of forming an insulating film on an upper surface of a semiconductor layer;
a step of forming an opening in the insulating film; and
a step of forming a gate electrode to bury the opening, the gate electrode having a T-shaped sectional shape and including an upper end and a lower end, the lower end being in contact with an upper surface of the insulating film on both sides of the opening, wherein the step of forming the gate electrode includes
a step of forming at the lower end a lower electrode made of Pt to be in contact with the semiconductor layer in the opening, and
a step of executing thermal treatment to the gate electrode to sink the lower electrode in the semiconductor layer,
wherein a width of an upper end is larger than a width of the lower end.

8. The method of manufacturing a field effect transistor according to claim 7, wherein the semiconductor layer includes a layer made of a compound semiconductor.

9. The method of manufacturing a field effect transistor according to claim 8, comprising a step of forming an n-type GaAs layer by crystal growth on a side surface of the semiconductor layer, wherein the compound semiconductor layer has an HEMT structure including a GaAs layer.

10. The method of manufacturing a field effect transistor according to claim 8, comprising a step of forming an n-type InGaAs layer by crystal growth on a side surface of the semiconductor layer, wherein the compound semiconductor layer has an HEMT structure including an InP layer.

11. The method of manufacturing a field effect transistor according to claim 7, comprising a step of etching the semiconductor layer to form a concave portion wider than a width of the gate electrode on the upper surface of the insulating film, wherein the opening is formed in a bottom surface of the concave portion.

* * * * *